(12) United States Patent
Rodgers

(10) Patent No.: US 6,875,257 B2
(45) Date of Patent: Apr. 5, 2005

(54) PARTICLE FILTER FOR MICROELECTROMECHANICAL SYSTEMS

(75) Inventor: Murray Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 118 days.

(21) Appl. No.: 10/223,987

(22) Filed: Aug. 20, 2002

(65) Prior Publication Data

US 2004/0036173 A1 Feb. 26, 2004

(51) Int. Cl.$^7$ .............................. B03C 3/00; B03C 3/14; B03C 3/51; B01D 46/00; C23F 1/00
(52) U.S. Cl. .................. 96/65; 96/69; 96/72; 55/385.1; 55/385.6; 55/442; 55/484; 55/522; 55/524; 55/529; 216/2; 216/11; 216/13; 216/41; 216/56; 428/641; 427/58
(58) Field of Search .............................. 55/385.1, 385.6, 55/442, 484, 522, 523, 524, 529, DIG. 39; 96/65, 69, 70, 72; 216/2, 11, 13, 41, 56; 428/119, 641; 427/58, 255.7

(56) References Cited

U.S. PATENT DOCUMENTS

| | | | | |
|---|---|---|---|---|
| 4,690,750 A | * | 9/1987 | Roxlo et al. .................. 55/529 |
| 5,882,496 A | * | 3/1999 | Northrup et al. .............. 55/523 |
| 5,938,923 A | * | 8/1999 | Tu et al. ......................... 216/2 |
| 6,110,247 A | * | 8/2000 | Birmingham et al. ......... 55/524 |
| 6,120,573 A | * | 9/2000 | Call et al. ...................... 55/524 |
| 6,187,412 B1 | * | 2/2001 | Armacost et al. ............... 216/2 |
| 6,524,488 B1 | * | 2/2003 | Insley et al. .................... 96/69 |

* cited by examiner

Primary Examiner—Duane Smith
Assistant Examiner—Jason M. Greene
(74) Attorney, Agent, or Firm—Marsh Fischmann & Breyfogle LLP

(57) ABSTRACT

A particle filter for microelectromechanical systems is provided that includes a particle trap formed on a substrate material. The particle trap includes an array of multidimensional geometric structures in an adjacent relationship. The geometric structures further define a plurality of multidimensional voids therebetween for trapping particles therein. The individual multidimensional geometric structures are formed by a plurality of vertically interconnected geometric shapes to define different configurations of voids between the adjacent geometric structures. In one embodiment of the filter system, an electrical bias is applied to the array of multidimensional geometric structures to facilitate attracting and trapping of particles in the filter.

27 Claims, 6 Drawing Sheets

PARTICLE FILTER FOR MICROELECTROMECHANICAL SYSTEMS

FIELD OF THE INVENTION

The invention is related to the field of microelectromechanical systems, and in particular, to a particle filter that prevents particulate contamination of the micro-electrical and/or micro-mechanical devices that make up these systems.

BACKGROUND OF THE INVENTION

Microelectromechanical systems include highly miniaturized devices that employ electrical and/or mechanical components. These systems are typically fabricated using integrated circuit batch-processing techniques. There are a number of fabrication technologies, collectively known as micromachining, for producing microelectromechanical systems. One type of micromachining process is surface micromachining. Surface micromachining involves deposition and photolithographic patterning of alternate layers of structural material (typically polycrystalline silicone, termed polysilicon) and sacrificial layers (typically silicon dioxide, termed oxide) on a silicon wafer substrate material. Using a series of deposition and patterning, functional devices are constructed layer by layer. After a device is completed, it is released by removing all or some of the remaining sacrificial material by exposure to a selective etchant such as hydrofluoric acid, which does not substantially attack the polysilicon layers.

Unfortunately, it is a problem in the art of microelectromechanical systems to prevent particle contamination. Particle contamination can potentially ruin an entire system by interfering with the electrical signals and/or mechanical movements of some or all of the electrical and/or mechanical devices. Furthermore, as will be appreciated, such particle contamination has a high likelihood of occurring in areas of the microelectromechanical system that have a high density of surface features, and thereby can potentially cause the most significant harm.

SUMMARY OF THE INVENTION

It is therefore an object of the present invention to provide a particle filter and method of fabricating the same for microelectromechanical systems. It is another object of the present invention to provide a particle filter that traps particles in areas void of electrical and/or mechanical devices. Yet another object of the present invention is to provide a particle filter that traps particles before such particles can travel to areas populated by the electrical and/or mechanical devices of the system.

In carrying out the above objects, and other objects, features, and advantages of the present invention, a particle filter for microelectromechanical systems is provided that includes a particle trap formed on a substrate material. The particle trap includes an array of multidimensional geometric structures in an adjacent relationship that define a plurality of multidimensional voids therebetween for trapping particles therein.

Various refinements exist of the features noted in relation to the subject particle filter. Further features may also be incorporated into the filter system to form multiple examples of the present invention. These refinements and additional features will be apparent from the following description and may exist individually or in any combination. For instance, an electrical bias may be applied to the array of multidimensional geometric structures to facilitate attracting and trapping of particles in the voids. In this regard, an electrical bus interconnecting the plurality of structures to an electrical source may provide the electrical bias. In another feature of the subject particle filter the array of multidimensional geometric structures may each comprise a plurality of vertically interconnected geometric shapes. Such vertically interconnected geometric shapes operate to define different configurations of voids between the adjacent geometric structures formed by the geometric shapes. In a preferred example, the geometric shapes making up a geometric structure are chosen to define voids that include larger openings in a top portion with the openings narrowing toward a bottom portion near the substrate material. In this regard, numerous combinations of such geometric shapes may be utilized to form the array of geometric structure as a matter of design choice.

In carrying out the above objects, and other objects, features, and advantages of the present invention, a microelectromechanical system is provided that includes at least one micro-device and at least one particle trap formed in an area void of the least one micro-device. The at least one particle trap includes the array of adjacent geometric structures for trapping particles in a plurality of voids defined by the plurality of adjacent geometric structures.

Various refinements exist of the features noted in relation to the subject microelectromechanical system. Further features may also be incorporated into the system to form multiple examples of the present invention. These refinements and additional features will be apparent from the following description and may exist individually or in any combination. For instance, a plurality of particle traps each including arrays of geometric structures may be included in the microelectromechanical system in the areas void of the micro-devices. Advantageously, the plurality of particle traps provide a more uniform surface topography during manufacturing of a microelectromechanical system and thus help to prevent undesired characteristics such as "dishing" of the microdevices, which often occurs during chemical mechanical polishing steps of the fabrication process.

Similar to the above aspect, an electrical bias may be applied to the plurality of particle traps to facilitate attracting and trapping of particles in the voids. In this regard, an electrical bus interconnecting the plurality of structures of a single particle trap to an electrical source may provide the electrical bias. Alternatively, an electrical bus interconnecting the plurality of particle traps to an electrical source may provide the electrical bias.

Also similar to the above aspect, the array of multidimensional geometric structures making up the one or more particle traps may each comprise a plurality of vertically interconnected geometric shapes that operate to define different configurations of voids between the adjacent geometric structures. In a preferred example, the geometric shapes making up an array of geometric structures are chosen to define voids that include larger openings in the top portion with the openings narrowing toward the bottom portion near the substrate material. In this regard, numerous combinations of such geometric shapes may be utilized to form the arrays of geometric structures for the plurality of particle traps as a matter of design choice.

In carrying out the above objects, and other objects, features, and advantages of the present invention, a method of fabricating a particle filter for a microelectromechanical system is provided. The method includes the step of depositing and patterning a plurality of alternating layers of filter forming material and sacrificial material on a substrate material to form a plurality of adjacent multidimensional geometric structures. The method also includes removing the sacrificial material to release the plurality of multidimensional geometric structures to define a plurality of multidimensional voids for trapping particles therein.

Various refinements exist of the features noted in relation to the present method. Further features may also be incorporated into the present method to form multiple examples of the invention. These refinements and additional features will be apparent from the following description and may exist individually or in any combination. For instance, the method may also include depositing and patterning an electrical layer on the substrate material, prior to forming the array of adjacent geometric structures, to electrically bias the geometric structures. As with the above embodiments, the electrical layer may be in the form of an electrical bus interconnecting the array of structures to an electrical source. Further, in this regard, the depositing and patterning of the plurality of alternating layers may include the step of forming a plurality of vertically interconnected geometric shapes that make up the geometric structures. Additional aspects, advantages and applications of the present invention will be apparent to those skilled in the art upon consideration of the following.

DETAILED DESCRIPTION

Figure 1:
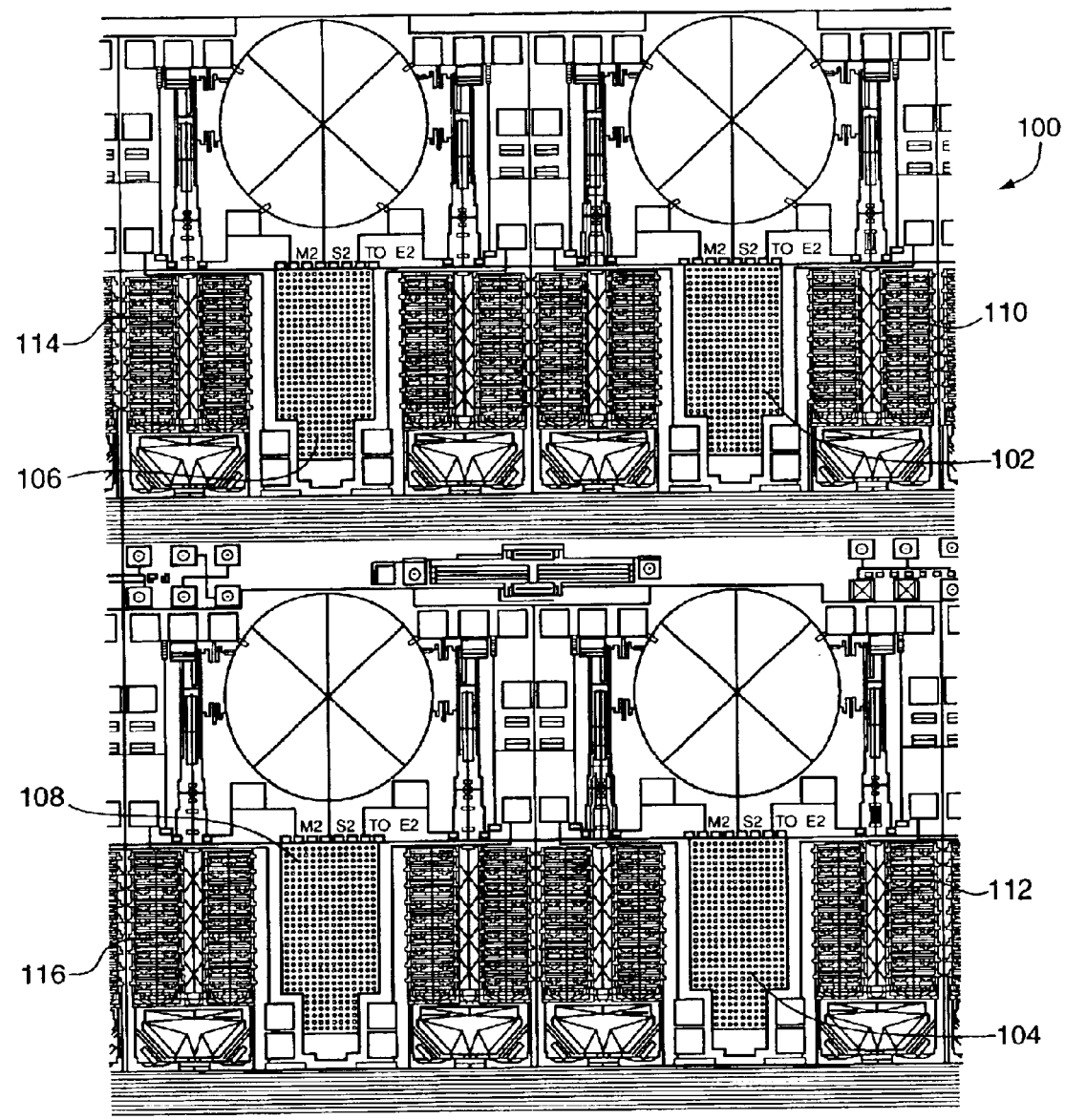
FIG. 1 illustrates an example of a microelectromechanical system configured with a particle filter according to the present invention.

Reference will now be made to the accompanying drawings, which at least assist in illustrating the various pertinent features of the present invention. For purposes of illustration, the following description is related to the formation of particle filters for microelectromechanical (MEM) systems, although it will be appreciated that the present particle filter is easily formed and useful for both micromechanical and microelectromechanical systems. In addition, one or more micro-devices or microstructures may define any given micromechanical or microelectromechanical system.

Surface micromachining is the preferred type of technique for fabricating the particle filter described herein, although other techniques may be utilized as well. Moreover, in certain instances it may be desirable to use a combination of two or more fabrication techniques to define a given MEM system. Since surface micromachining is the preferred fabrication technique for the particle filter and MEM systems described herein, the basic principles of surface micromachining will first be described. Initially, various surface micromachined microstructures and surface micromachining techniques are disclosed in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798,283, issued Aug. 25, 1998, and entitled "METHOD FOR INTEGRATING MICROELECTROMECHANICAL DEVICES WITH ELECTRONIC CIRCUITRY; U.S. Pat. No. 5,804,084, issued Sep. 8, 1998, and entitled "USE OF CHEMICAL MECHANICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED, the entire disclosures of which are incorporated by reference in their entirety herein.

Surface micromachining generally entails depositing typically alternate layers of structural material and sacrificial material using an appropriate substrate which functions as the foundation for the resulting microstructures. A dielectric isolation layer is typically formed directly on an upper surface of the substrate on which a MEM system is to be fabricated, and a structural layer will be formed directly on an upper surface of the dielectric isolation layer. This particular structural layer is typically patterned and utilized for establishing various electrical interconnections for the MEM system, which is thereafter fabricated thereon. Other layers of sacrificial and structural materials are then sequentially deposited to define the various microstructures and devices of the MEM system. Various patterning operations may be executed on one or more of these layers before the next layer is deposited to define the desired microstructure. After the various microstructures are defined in this general manner, the desired portions of the various sacrificial layers are removed by exposing the "stack" to one or more etchants. This is commonly called "releasing." During releasing, at least certain of the microstructures are released from the substrate to allow some degree of relative movement between the microstructure(s) and the substrate. In certain situations, not all of the sacrificial material used in the fabrication is removed during the release. For instance, sacrificial material may be encased within a structural material to define a microstructure with desired characteristics (e.g., a prestressed elevator microstructure).

Surface micromachining can be done with any suitable system of a substrate, sacrificial film(s) or layer(s), and structural film(s) or layer(s). Many substrate materials may be used in surface micromachining operations, although the tendency is to use silicon wafers because of their ubiquitous presence and availability. The substrate again is essentially a foundation on which the microstructures are fabricated. This foundation material must be stable to the processes that are being used to define the microstructure(s) and cannot adversely affect the processing of the sacrificial/structural films that are being used to define the microstructure(s).

With regard to the sacrificial and structural films, the primary differentiating factor is a selectivity difference between the sacrificial and structural films to the desired/required release etchant(s). This selectivity ratio is preferably several hundred to one or much greater, with an infinite selectivity ratio being preferred. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example).

Figure 2:
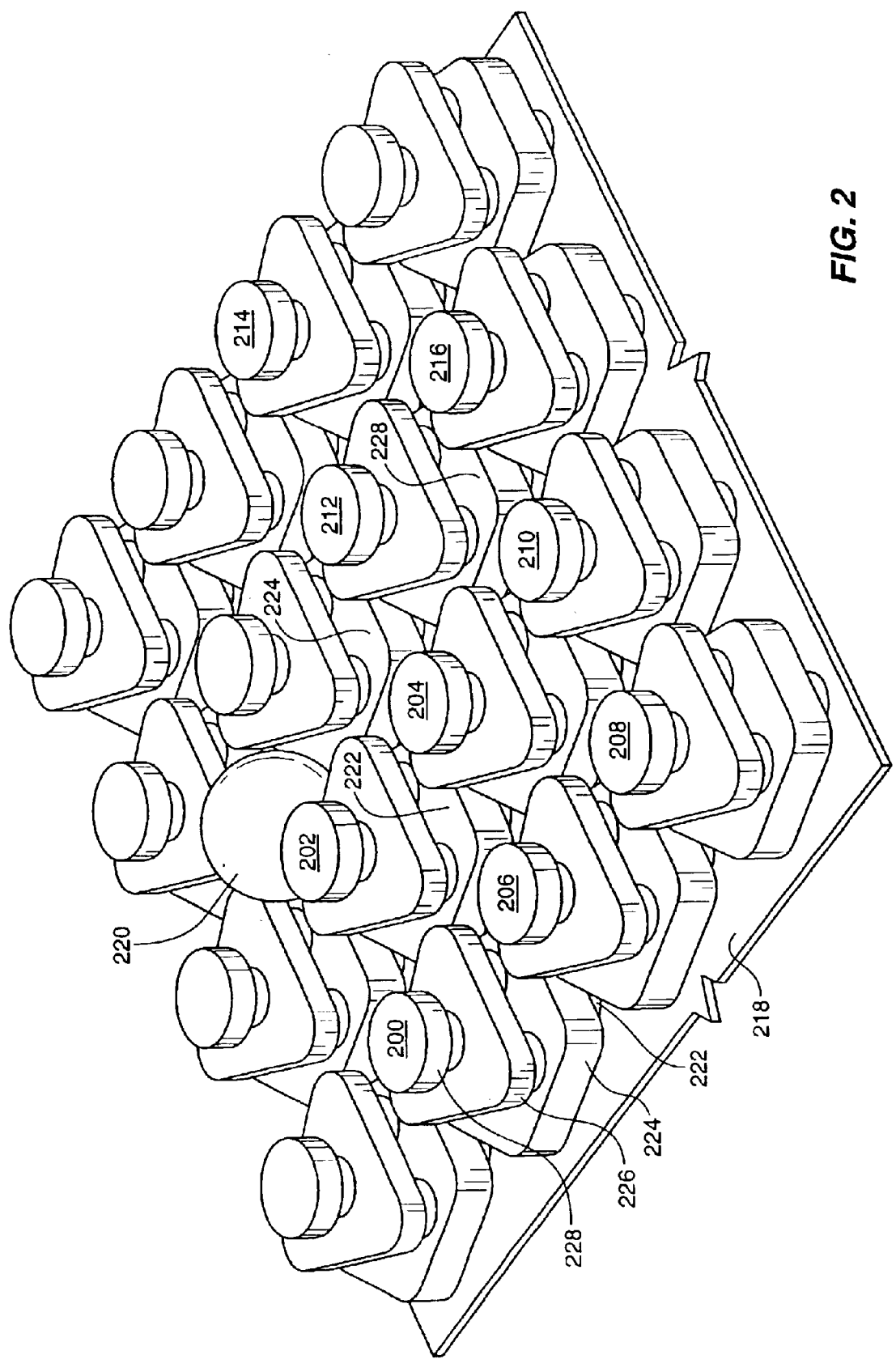
FIG. 2 illustrates an example of a particle filter according to the present invention.
Figure 3:
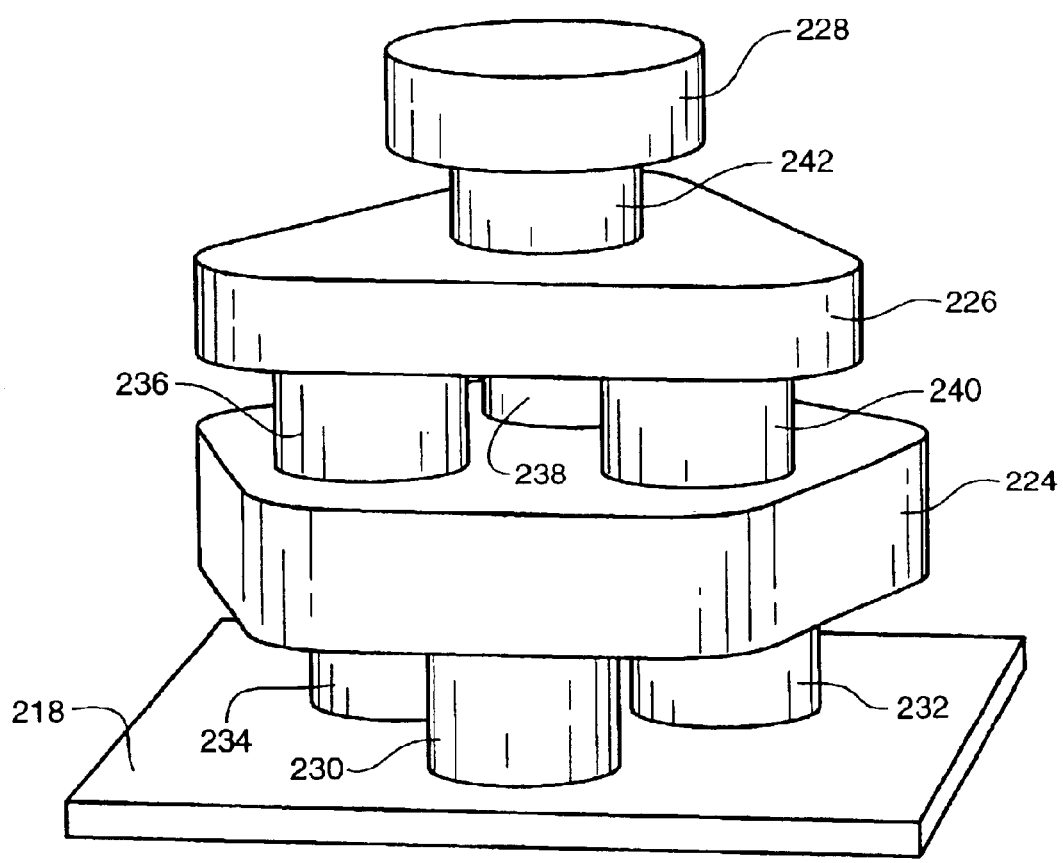
FIG. 3 illustrates an example of an individual geometric structure of the particle filter of FIG. 2

Referring to FIGS. 1–3, FIG. 1 illustrates an example of a MEM system configured with multiple particle filters 102–108 according to the present invention, namely MEM system 100. A typical MEM system, such as system 100, may conventionally include one or micro-devices, e.g. devices 110–116, which could be mechanical, electrical or electromechanical in nature. In addition, such micro-devices, e.g. 110–116, typically do not occupy the entire real estate available for a MEM system such as system 100. In this regard, the present particle filters 102–108 are preferably formed in areas that would otherwise be void of the micro-devices, e.g. devices 110–116 of MEM system 100. The particle filters 102–108 are designed to capture and retain potentially contaminating particles away from the micro-devices 112–116 making up the MEM system 100. The present particle filters 102–108 are also designed to capture and retain the potentially contaminating particles before they reach areas of the MEM system 100 occupied by the micro-device 112–116, thereby protecting the devices from particulate contamination.

An additional benefit provided by the particle filters 102–108 in a MEM system, such as system 100, is that a more uniform surface topography is provided during the manufacturing process. This in turn reduces the potential for "dishing," which often occurs during the chemical mechanical polishing due to loading effects. In applications, such as optical switches, dishing is highly undesirable in that it negatively affects the impact of the mirror curvature and thus the light reflectivity off of the mirror surface.

FIG. 2 illustrates an exemplary partial perspective view of a particle filter according to the present invention, namely particle filter 102. FIG. 3 illustrates an example of one of the geometric structures 200 that make up the particle filter 102. For purpose of illustration, the following description will now be directed toward the operation and fabrication of the particle filter 102. It will be appreciated however, that the following discussion applies equally to the particle filters 104–108, as well as other particle filters described herein.

The particle filter 102 includes an array of multidimensional geometric structures, e.g. structures 200–216 etc. formed in an adjacent relationship on a substrate 218 of the MEM system 100. The geometric structures 200–216, in turn, define an array of multidimensional voids therebetween, e.g. voids 222–228, for capturing and trapping potentially contaminating particles, such as particle 220. In other words, the present particle filters 102–108 operate as a mechanical filter by providing a high density of surface features to attract and trap particles within the voids, e.g. 222–228 defined between adjacent geometric structures.

The geometric structures 200–216 each include a plurality of vertically interconnected geometric shapes, e.g. geometric shapes 224–228, of geometric structure 200. In this regard, the geometric shapes, e.g. 224–228, that make up the geometric structures 200–216 are selected to define the plurality of voids, e.g. voids 222–228, so that the voids include larger openings in their top portions and smaller openings at their bottom portions (near the substrate 218) to facilitate the entry and trapping of particles therein. In other words, the plurality of geometric voids, e.g. voids 222–228, may be substantially frusta conical having larger openings at their top and tapering down as they approach the substrate 218. It should also be noted that the size of the voids, e.g. 222–228, is primarily a function of the particle size that the particle filters 102–108 are designed to trap. In this regard, particles can rage in size range from the sub-micron level and larger. Further in this regard, a typical particle size that is of concern in a MEM system, such as system 100, is in the range of one micron to twenty-five microns. Therefore, the plurality of voids, e.g. 222–228, preferably have openings slightly larger than the larger particles, e.g. slightly larger than twenty five microns, in their top portions, with the openings tapering down near the substrate 218. It should be noted that the lower limit for the openings near the substrate is somewhat determined by feature size limitations resulting from the fabrication process. It will be appreciated, however, that numerous spacing of the geometric structures 200–216 may be utilized according to the principles of the present invention, to achieve different void sizes as a matter of design choice. For instance, some of the geometric structures 200–216 may be spaced closer than other ones of the geometric structures 200–216 to create different void sizes within the same particle filter 102. Further, in this regard, the geometric structures 200–216 may be constructed from a variety of different geometric shapes to achieve different configurations for the voids, e.g. voids 222–228. Additionally, other geometric shapes may be utilized as a matter of design choice to accommodate different spatial considerations in a MEM system, such as the MEM system 100. Still further yet, it is not necessary that each of the geometric structures 200–216 include the same geometric shapes, e.g. shapes 224–228, although this may be preferable to facilitate efficient manufacturing of the particle filter 102.

As noted above, the present particle filters, e.g. particle filter 102, operates as a mechanical filter by providing a high density of surface features to attract and trap particles. In another embodiment of the present particle filter, an electrical bias may be applied to the geometric structures, e.g. structures 200–216, of the particle filter 102. Electrically biasing the geometric structures 200–216 of a particle filter creates an array of electrostatic attractors for potentially contaminating particles. Advantageously, such an array of electrostatic attractors may function to attract and trap particles within the voids, e.g. 222–228, even where the particles are larger than the voids as particles are often irregular in shape and can become trapped even if they are not totally buried within the filter 102. Those skilled in the art will appreciate that an electrical bus interconnecting the array of geometric structures to an electrical source may provide such electrical bias, as will be further described herein below.

FIGS. 4–14 Illustrate one example of a fabrication protocol for the particle filter 102. In this regard, only those portions of the particle filter 102 and MEM system 100 that are relevant to the present discussion will be illustrated and described herein. Those skilled in the art will appreciate, however, that since the particle filter 102 is preferably fabricated using micromachining, various other combinations of depositions and surface machining that are within the scope of the present invention exist to produce particle filters according to the principles disclosed herein.

Figure 4:
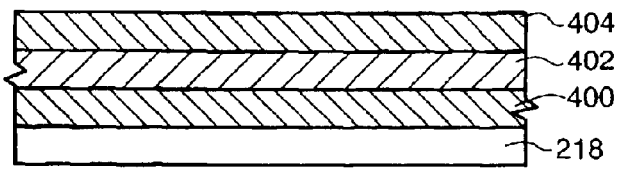
FIG. 4 illustrates an example of the fabrication of the particle filter of FIG. 2.

Referring first to FIG. 4, there is shown a cross sectional view of the fabrication process for the particle filter 102 completed to an electrical conductor layer 404. The electrical conductor layer 404 is typically formed on a pair of dielectric isolation layers, 400 and 402. The dielectric isolation layers, 400 and 402, may be a thermal oxide layer and silicon nitride layer respectively, formed by a conventional thermal diffusion process as is well known in the integrated circuit art.

The electrical conductor layer 404, may be a layer of polysilicon blanket deposited over the top surface of the dielectric isolation layer 402 to form electrical wiring on the substrate 218. In one example of the invention, the electrical conductor layer 404 may form the electrical bus connecting the various geometric structures 200–216 of the particle filter 102 and/or the particle filters 102–108. In this regard, the electrical conductor layer 404 may be utilized to electrically bias the geometric structures 200–216 so that the structures 200–216 electrostatically attract potentially contaminating particles. Advantageously, the electrostatic attraction improves the efficiency of the particle filter 102, by attracting particles to the filter 102 and ensuring that the particles are trapped prior to entering an area occupied by the micro-devices, e.g. 110–116. In this regard, the electrostatic attraction may also attract potentially contaminating particles from areas occupied by the micro-devices, e.g. 110–116 to the particle filter 102. The electrical conductor layer 404 also forms a ground plane underlying the various micro-devices, e.g. devices 110–116, and particle filters, e.g. particle filters 102–108, which can be formed on the substrate 218 at the same time.

The term "substrate" as used herein means those types of structures that can be handled by the types of equipment and processes that are used to fabricate micro-devices on a substrate using one or more micro-photolithographic patterns. An exemplary material for the substrate 218 includes silicon. Further in this regard, the various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD), and including evaporative PVD, and sputtering PVD, and chemical-mechanical polishing (CMP) as examples.

Figure 5:
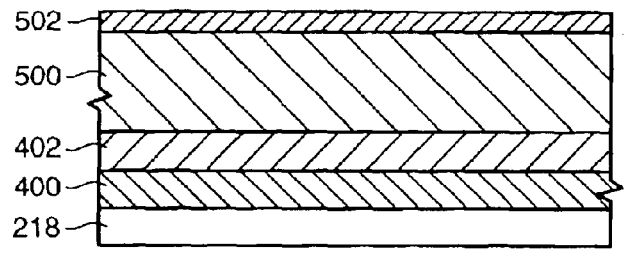
FIG. 5 illustrates additional details of the fabrication of the particle filter of FIG. 2.
Figure 6:
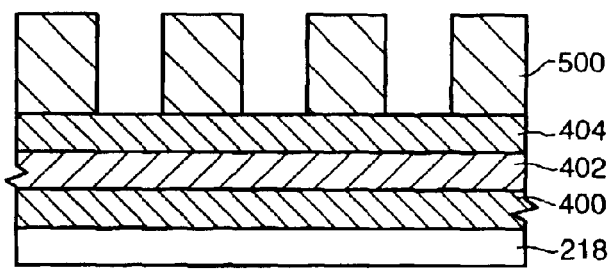
FIG. 6 illustrates additional details of the fabrication of the particle filter of FIG. 2.
Figure 7:
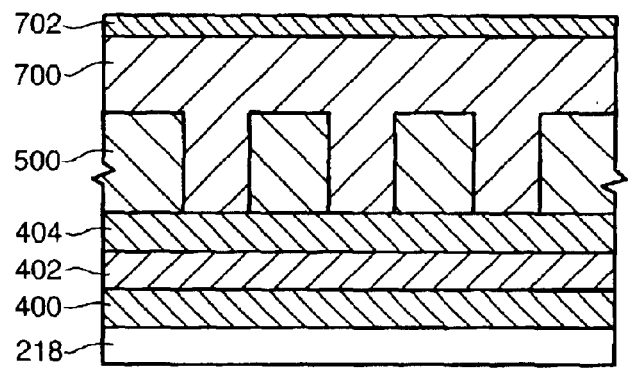
FIG. 7 illustrates additional details of the fabrication of the particle filter of FIG. 2.
Figure 8:
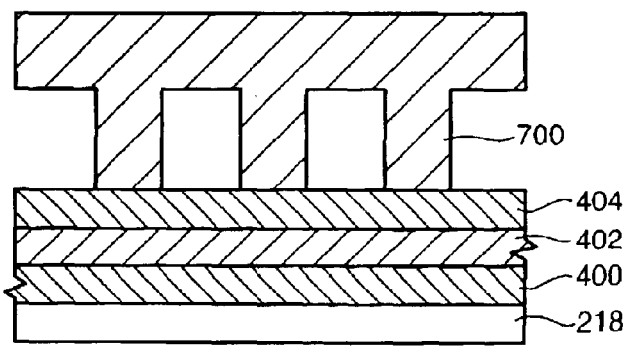
FIG. 8 illustrates additional details of the fabrication of the particle filter of FIG. 2.

Referring to FIGS. 5–7, after formation of the electrical conductor layer 404, a sacrificial layer of oxide 500 is deposited thereon. Exemplary materials for the sacrificial layer 500, as well as other sacrificial layers described herein, include undoped silicon dioxide or silicon oxide, and doped silicon dioxide or silicon oxide ("doped" indicating that additional elemental materials are added to the film during or after deposition). The sacrificial oxide layer 500 may be patterned using photolithographic masking and etching to form a first level of support posts, e.g. posts 230–234 shown on FIG. 3, for the particle filter 102. In this regard and, a thin layer of light sensitive photoresist 502 may be spun onto the sacrificial layer 500. The layer 500 may then be exposed to light using an oxide mask to etch voids, e.g. 504–508, in the sacrificial layer 500 that will become the first level of support posts, e.g. 230–234 for the geometric structures 200–216. After etching, the remaining photoresist may then be stripped away resulting in the structure of FIG. 6.

Figure 9:
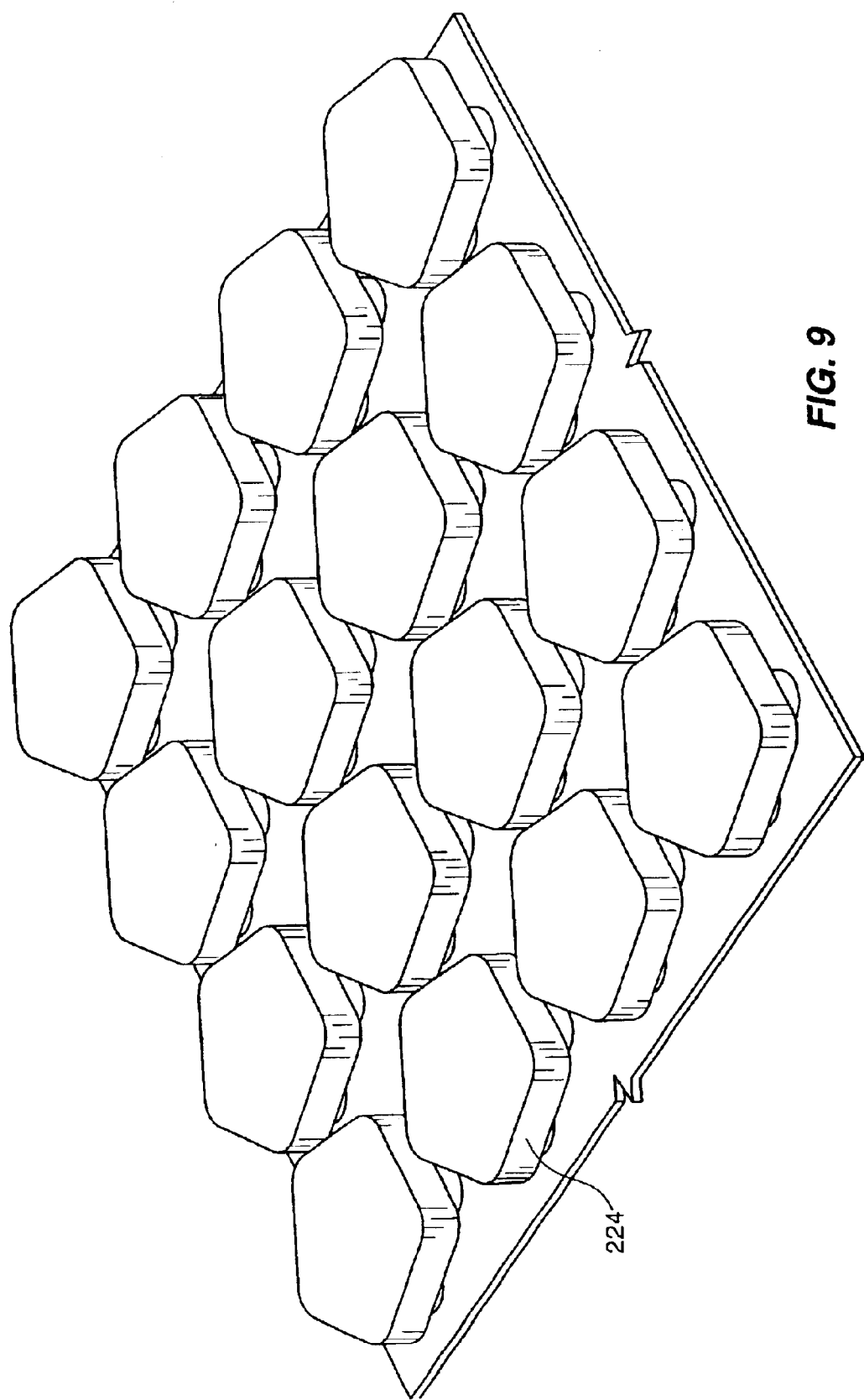
FIG. 9 illustrates a partially completed fabrication of the particle filter of FIG. 2 completed to the first layer of geometric shapes making up the geometric structures.
Figure 10:
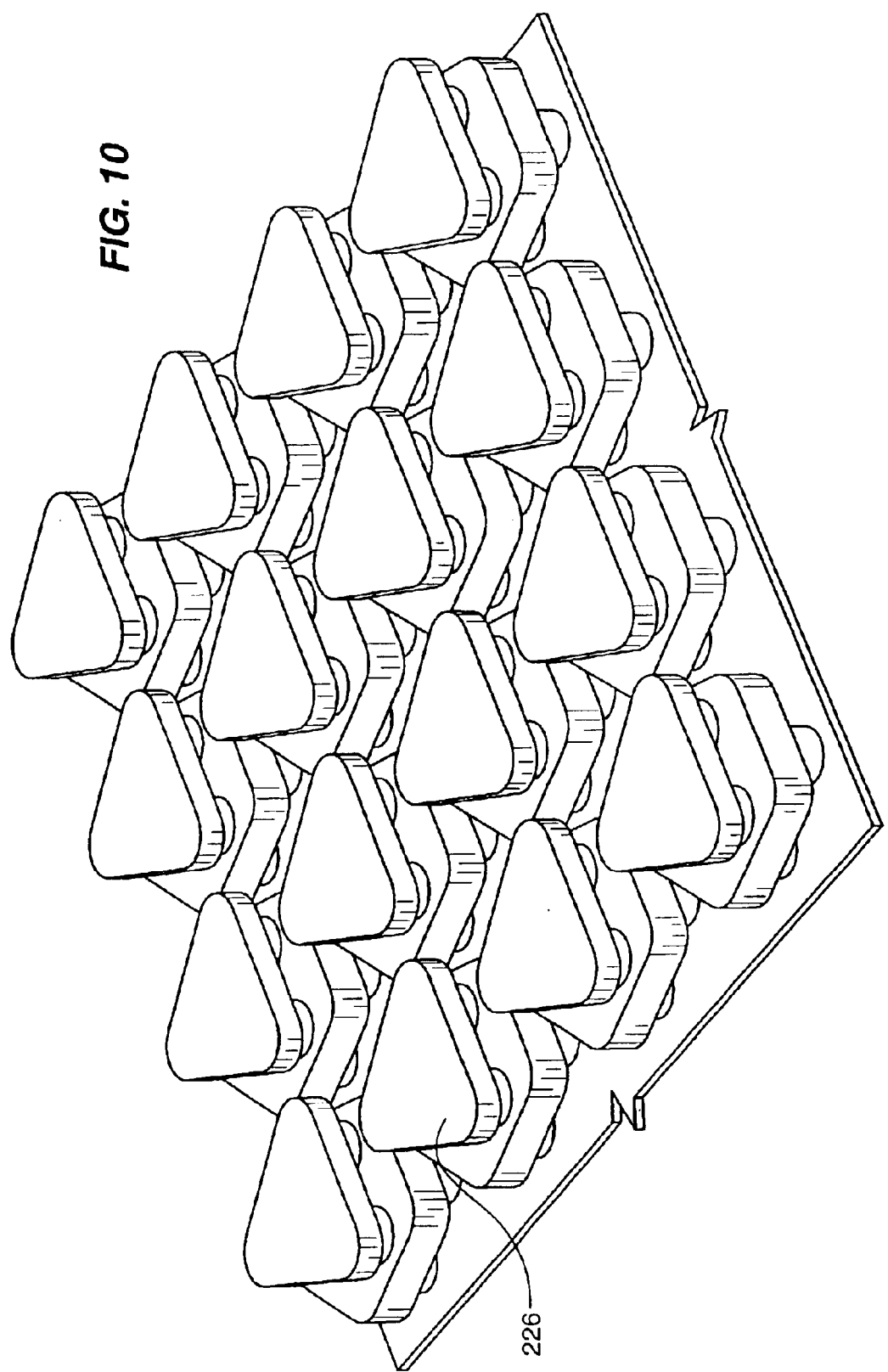
FIG. 10 illustrates a partially completed fabrication of the particle filter of FIG. 2 completed to the second layer of geometric shapes making up the geometric structures.

Referring to FIG. 7, after patterning of the first level of support posts, e.g. posts 230–234, a structural layer 700 is deposited on the sacrificial layer 500 filling in voids 504–508. Exemplary materials for the structural layer 700 as well as other structural layers that are described herein include doped or undoped polysilicon and doped or undoped silicon. As with the sacrificial layer 500, the structural layer 700 may be patterned using photolithographic masking and etching to form the first layer of geometric shapes for the filter system 102, e.g. geometric shape 224 of structure 200. In this regard, another thin layer of light sensitive photoresist 702 may be spun onto the layer 700 and exposed to light using an oxide mask to form the first layer of geometric shapes, e.g. shape 224. The remaining portions of the structural layer 700 not protected by the photoresist are then etched away. The etch release step may utilize a selective wet etchant that etches away exposed portions of the layers 700 over time, while leaving the intact portions protected by the photoresist to form/release the first layer of geometric shapes as illustrated in FIG. 9. Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)). In this manner, the above-described process may be repeated to form the second level of support posts, e.g. posts 236–240 shown on FIG. 3, and geometric shapes as illustrated in FIG. 10. Further, in this regard, the process may thereafter be repeated again to form the third level of support posts, e.g. post 242 shown on FIG. 3, and final layer of geometric shapes, e.g. shape 228 shown on FIG. 3 to form the completed particle filter 102 of FIG. 2.

Those skilled in the art will appreciate variations of the above-described embodiments that fall within the scope of the invention. As a result, the invention is not limited to the specific examples and illustrations discussed above, but only by the following claims and their equivalents.

I claim:

1. A particle filter for a microelectromechanical system, the particle filter comprising:

a substrate material; and a particle trap formed on the substrate material, the particle trap comprising:

a plurality of multidimensional geometric structures in an adjacent relationship, wherein the plurality of multidimensional geometric structures define a plurality of multidimensional voids therebetween for trapping particles therein and an electrical layer formed on the substrate material to electrically bias the plurality of geometric structures.

2. The particle filter of claim 1 wherein the electrical layer comprises:

an electrical bus interconnecting the plurality of adjacent geometric structures to an electrical source.

3. The particle filter of claim 1 wherein the plurality of geometric structures each comprise:

a plurality of vertically interconnected geometric shapes.

4. The particle filter of claim 1 wherein the plurality of voids defined by the plurality of adjacent geometric structures are substantially frusta conical.

5. The particle filter of claim 1 wherein the plurality of adjacent geometric structures are formed on the substrate material in areas void of other micro-devices.

6. The particle filter of claim 1 wherein the plurality of geometric structures are adjacent but non-interconnected.

7. A microelectromechanical system comprising a substrate material;

at least one micro-device formed on the substrate material;

at least one particle trap formed on the substrate material in an area void of the at least one micro-device, the at least one particle trap comprising:

a plurality of multidimensional geometric structures in an adjacent relationship, wherein the plurality of multidimensional geometric structures define a plurality of multidimensional voids therebetween for trapping particles therein.

8. The system of claim 7 comprising:
a plurality of particle traps formed on the substrate material in areas void of the at least one micro-device, wherein in each of the plurality of particle traps comprises:
a plurality of multidimensional geometric structures in an adjacent relationship, wherein the plurality of multidimensional geometric structures define a plurality of multidimensional voids therebetween for trapping particles therein.

9. The system of claim 7 comprising:
an electrical layer formed on the substrate material to electrically bias the plurality of geometric structures.

10. The system of claim 9 wherein the electrical layer comprises:
an electrical bus interconnecting the plurality of adjacent geometric structures to an electrical source.

11. The system of claim 7 wherein the plurality of geometric structures each comprise:
a plurality of vertically interconnected geometric shapes.

12. The system of claim 7 wherein the plurality of voids defined by the plurality of adjacent geometric structures are substantially frusta conical.

13. The system of claim 7 wherein the plurality of geometric structures are adjacent but non-interconnected.

14. A particle filter for a microelectromechanical system, the particle filter comprising:
a substrate material; and
a particle trap formed on the substrate material, the particle trap comprising:
a plurality of multidimensional geometric structures in an adjacent relationship, wherein the plurality of multidimensional geometric structures define a plurality of multidimensional voids for trapping particles therein; and
an electrical layer, formed on the substrate material, for interconnecting the plurality of geometric structures to an electrical source to apply an electrical bias to the plurality of geometric structures.

15. The particle filter of claim 14 wherein the plurality of geometric structures comprise:
a plurality of vertically interconnected geometric shapes.

16. The particle filter of claim 14 wherein the plurality of voids defined by the plurality of adjacent geometric structures are substantially frusta conical.

17. The particle filter of claim 15 wherein the plurality of adjacent geometric structures are formed on the substrate material in areas void of other micro-devices.

18. The particle filter of claim 14 wherein the plurality of geometric structures are adjacent but non-interconnected.

19. The particle filter of claim 14 wherein the electrical layer comprises:
an electrical bus interconnecting the plurality of adjacent geometric structures.

20. A method for constructing a particle filter in a microelectromechanical system, the method comprising:
depositing and patterning a plurality of alternating layers of filter forming material and sacrificial material on a substrate material to form a plurality of adjacent multidimensional geometric structures;
removing the sacrificial material to release the plurality of multidimensional geometric structures to define a plurality of multidimensional voids for trapping particles therein; and
depositing and patterning an electrical layer on the substrate material to electrically bias the plurality of multidimensional geometric structures, wherein the step of depositing and patterning the electrical layer occurs before the depositing and patterning of the plurality of alternating layers of filter forming material.

21. The method of claim 20 wherein the electrical layer comprises:
an electrical bus interconnecting the plurality of adjacent geometric structures to electrically bias the plurality of adjacent geometric structures.

22. The method of claim 20 wherein the step of depositing and patterning the plurality of alternating layers of filter forming material and sacrificial material comprises:
forming a plurality of vertically interconnected geometric shapes.

23. The method of claim 20 wherein the plurality of voids defined by the plurality of adjacent geometric structures are substantially frusta conical.

24. The method of claim 20 wherein the plurality of adjacent multidimensional geometric structures are formed on the substrate material in areas void of other microdevices.

25. The method of claim 20 wherein the plurality of adjacent multidimensional geometric structures are adjacent but non-interconnected.

26. A method for use in forming a microelectromechanical system, comprising the steps of:
forming at least one microdevice on a substrate material; and
forming at least one particle trap on the substrate material in an area void of the at least one microdevice, wherein the at least one particle trap includes a plurality of multidimensional geometric structures in an adjacent relationship, and the plurality of microdimensional geometric structures define a plurality of multidimensional voids therebetween for trapping particles.

27. The method of claim 26, further comprising the step of forming an electrical layer on the substrate and material to electrically bias the plurality of geometric structures.

* * * * *